United States Patent [19]

Thompson et al.

[11] Patent Number: 5,351,050
[45] Date of Patent: Sep. 27, 1994

[54] DETENT SWITCHING OF SUMMING NODE CAPACITORS OF A DELTA-SIGMA MODULATOR

[75] Inventors: Charles D. Thompson, Austin; Eric J. Swanson, Buda, both of Tex.

[73] Assignee: Crystal Semiconductor Corporation, Austin, Tex.

[21] Appl. No.: 970,693

[22] Filed: Nov. 3, 1992

[51] Int. Cl.[5] .............................................. H03M 3/00
[52] U.S. Cl. ..................................... 341/143; 341/172
[58] Field of Search ........................ 341/143, 144, 155; 375/26, 27, 28, 29, 33

[56] References Cited

U.S. PATENT DOCUMENTS

| | | | |
|---|---|---|---|
| 4,851,841 | 7/1989 | Sooch | 341/143 |
| 5,099,195 | 3/1992 | Greer et al. | 324/142 |
| 5,148,167 | 9/1992 | Ribner | 341/143 |

*Primary Examiner*—Brian K. Young
*Attorney, Agent, or Firm*—Robert D. Lott

[57] ABSTRACT

The thermal noise generated through the feedback capacitor of a delta-sigma modulator is attenuated by transferring a reference voltage through the capacitor in two separate steps during each sampling period. This permits a reduction in the size of the feedback capacitor, thereby reducing thermal noise, without increasing the voltage on the switching capacitors on the summing node side of the feedback capacitors which would induce degradation due to hot electron effects.

12 Claims, 6 Drawing Sheets

DETENT SWITCHING OF SUMMING NODE CAPACITORS OF A DELTA-SIGMA MODULATOR

TECHNICAL FIELD

The present invention pertains to switched capacitor circuits.

BACKGROUND OF THE INVENTION

Switched capacitor delta-sigma modulators are widely used in such applications as digital audio and industrial process control instrumentation. In such modulators the negative feedback around the modulator loop is provided by a switched capacitor which is connected between the output of the quantizer of the modulator and the input summing node of the modulator.

FIG. 1A is a block diagram of such a prior art delta-sigma modulator. As shown in FIG. 1A, the delta-sigma modulator 10 includes a summing node 12 which sums an input signal 14 with a feedback signal on line 16. The summing node is connected to the input of an integrator 18, and the output of the integrator is filtered through a loop filter 20. The output of the loop filter 20 is connected to the input of a quantizer or A/D convertor shown as a comparator 22. The output of the comparator 22 forms the output, DOUT, of the modulator on line 24 and also forms the input to the switched capacitor feedback circuit shown generally as 26. The output of the switched capacitor feedback circuit is the feedback signal to the summing node 12.

The switched capacitor feedback circuit 26 includes a first single pole, double throw switch 28, which switches between a reference voltage, Vref, and ground in response to the output signal DOUT on line 24. The feedback capacitor 30, shown as $C_{FB}$, has a first terminal connected to the pole of a switch 28, shown as element "a" of switch 28, and its opposite terminal connected to a node 32 which is also connected to the pole of another single pole, double throw switch 34. The pole of switch 34, shown as element "a" of switch 34, is either connected to throw "c" which is connected to ground, or to throw "b" which is connected the summing node 12 in a timing sequence that is well known in the art and shown in FIG. 2B.

More particularly, during the first part of each sampling period, switch 28 is connected to either throw "b" which is connected to Vref, or to throw "c" which is connected to ground, depending on the state of the DOUT signal on line 24 while switch 30 is coupled to ground. After the capacitor $C_{FB}$ has been charged, switches 28 and 30 are switched in order to provide the appropriate charge onto the summing node 12 as determined by the DOUT signal on line 24.

In FIG. 1B the timing signals for switch 28 and the voltage signal node 32 show a solid line when switch 28 is switching from the a-b to the a-c position and a dotted line when switch 28 is switching from the a-c position to the a-b position. The shaded area in the timing diagram for switch 28 indicates that the switches may be either closed or open depending on the output of the comparator 22 on line 24.

In delta-sigma modulators, it is desirable to minimize thermal noise induced on the feedback capacitor $C_{FB}$ by the sampling process occurring when a connection within switch 34 opens. (Switch 34, formed generally by two MOS transistors, operates in a "break-before-make" sequence.) This thermal noise voltage creates a thermal noise charge on $C_{FB}$ defined by $$Q_{noise} = \sqrt{kTC_{FB}} \tag{1}$$

where k is Boltzmann's constant and T is temperature in degrees Kelvin. It is desirable to minimize this thermal noise charge Qnoise. Since Qnoise is independent of Vref, Qnoise can be reduced by simultaneously reducing $C_{FB}$ by the same amount that vref is increased. The result keeps the feedback charge constant while simultaneously reducing Qnoise. This implies that Qnoise is at a practical minimum when $C_{FB}$ is made as small as possible, usually limited to the maximum practical value of Vref for a given circuit technology.

An important limitation is the limit on Vref imposed, by MOS transistor hot electron effects. See, for example, Sakurai et al., "Hot-Carrier Generation in Submicrometer VLSI Environment," IEEE Journal of Solid-State Circuits, Vol. SC-21, No. 1, February 1986, pp. 187–192; Saletti et al., "Correlated Fluctuations and Noise Spectra of Tunneling and Substrate Currents Before Breakdown in Thin-Oxide MOS Devices." IEEE Transactions on Electron Devices, Vol. 37, No. 11, November 1990, pp. 2411–2413; Tzou et al., "Hot-Electron-Induced MOSFET Degradation at Low Temperatures," IEEE Electron Device Letters, Vol EDL 6, No. 9, September 1985, pp. 450–452; and Lo et al., "Hot-Carrier-Stress Effects on Gate-Induced Drain Leakage current in n-channel MOSFET's," IEEE Electron Device Letters, Vol. 12, No. 1, January 1991, pp. 5–7.

Therefore, there is an upper limit on the applied voltage to the MOS transistor switch, switch 34, before the hot electron effects become undesirably large. The substrate current in switch 34 can be responsible for charge transfer errors as well as a potential second source of noise. It is therefore unproductive to increase Vref and decrease $C_{FB}$ to minimize Qnoise while at the same time inducing degradation due to hot electron effects. As shown in FIG. 1B, with the prior art circuit of FIG. 1A the magnitude of the voltage swing at node 32 is approximately Vref.

Various methods have been used in the past to minimize these effects including the use of fully differential input signals in which the hot electron effects become common mode noise and are therefore attenuated to some degree in the fully differential circuit. Also, in p-channel devices, where "hot holes" are generated rather than hot electrons, the amount of "hot holes" generated is approximately an order of a magnitude less than the corresponding number of hot electrons generated in an n-channel device. Therefore, using p-channel transistors inside switch 34 ameliorates hot carrier effects somewhat. However, a further problem can occur when using p-channel devices in a p well technology. When n-channel devices are fabricated in a p well technology, the p wells can be connected to a reference voltage to thereby desensitize the circuit to power supply noise. However, p-channel transistors in a p well technology share a common substrate, and it is not possible to drive an n substrate with a reference voltage. Therefore, the p-channel devices in these circumstances are more susceptible to power supply noise.

Therefore, it can be appreciated that a circuit which allows the use of a large reference voltage without the hot carrier induced problem is highly desirable.

SUMMARY OF THE INVENTION

Accordingly, it is an object of the present invention to provide a circuit for minimizing the thermal noise of a switched feedback capacitor.

Shown in an illustrated embodiment of the invention is a switched capacitor circuit in which the input signal to the capacitor is coupled to a different voltage N times during a sampling period, where N is greater than 2, and the other side of the sampling capacitor is switched between a reference voltage and an output node once during the sampling period.

Also shown in an illustrated embodiment of the invention is a method for transferring charge to an output terminal which includes the steps of first charging a capacitor to a first voltage by coupling a first terminal of the capacitor to a first voltage while coupling the second terminal to a reference voltage. Then coupling the second terminal to an output terminal with the first terminal coupled to the first voltage. Then coupling the first terminal to a second reference voltage while the second terminal remains coupled to the output terminal, and then coupling the first terminal to a third voltage. The second voltage having a magnitude which is between that of the first voltage and the third voltage.

BRIEF DESCRIPTION OF THE DRAWINGS

The aforementioned and other features, characteristics, advantages, and the invention in general, will be better understood from the following, more detailed description taken in conjunction with the accompanying drawings, in which.

Figure 1A:
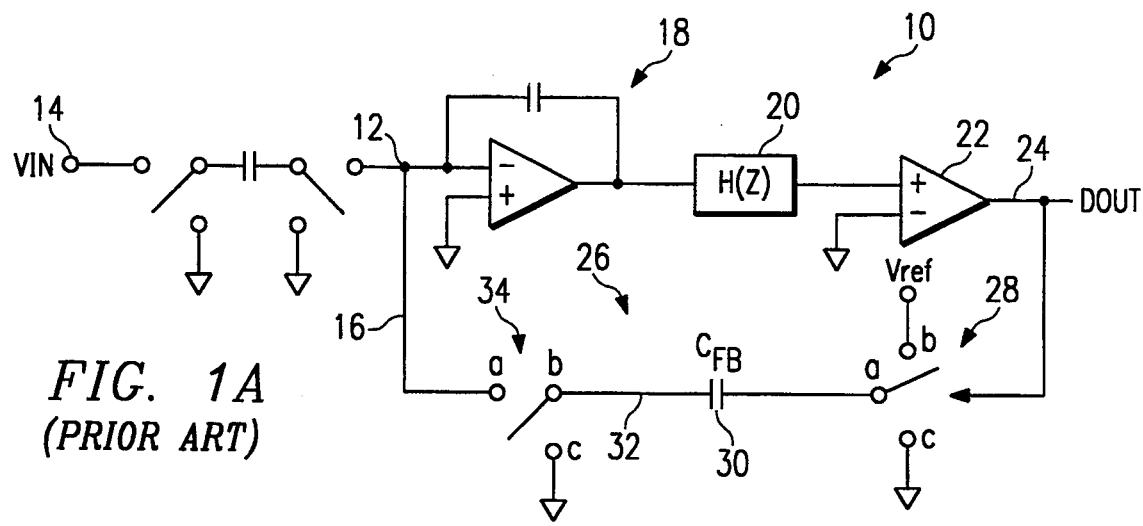
FIG. 1A is a block diagram of a prior art delta-sigma modulator.
Figure 1B:
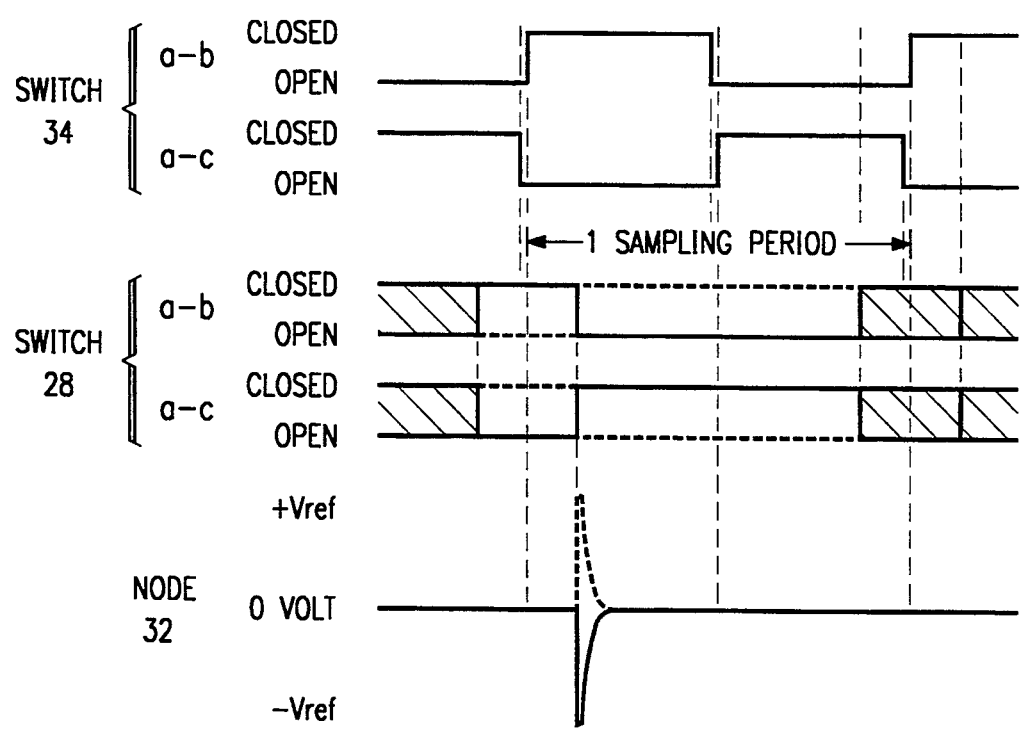
FIG. 1B is a timing diagram for the switched capacitor feedback circuit shown in FIG. 1A.
Figure 2A:
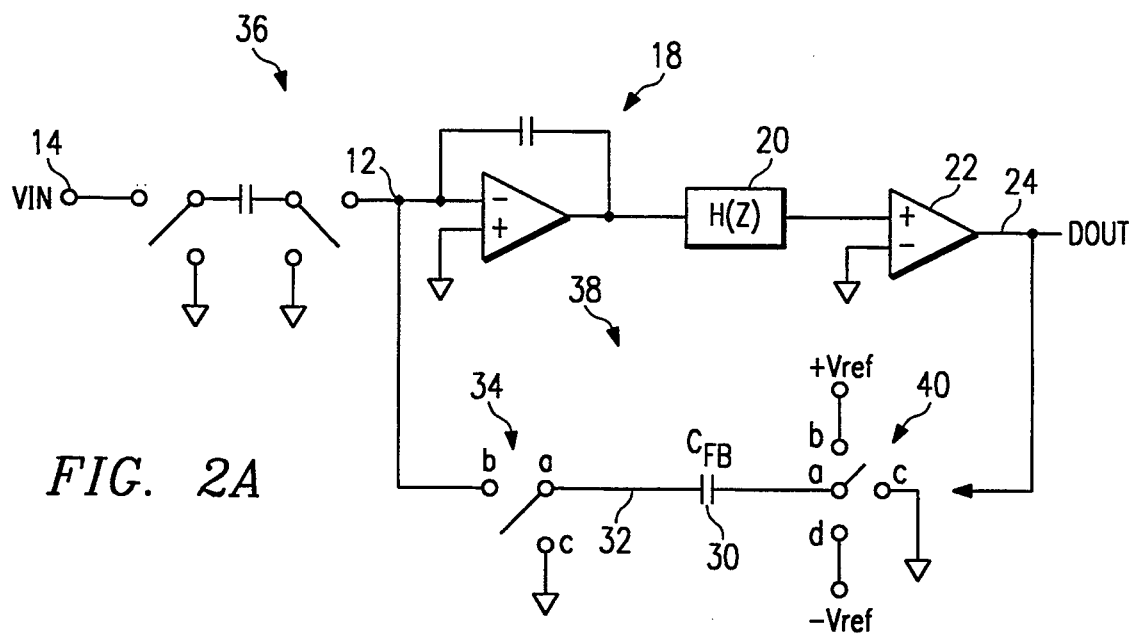
FIG. 2A is a block diagram of a delta-sigma modulator which includes a switched capacitor feedback circuit according to the present invention.
Figure 2B:
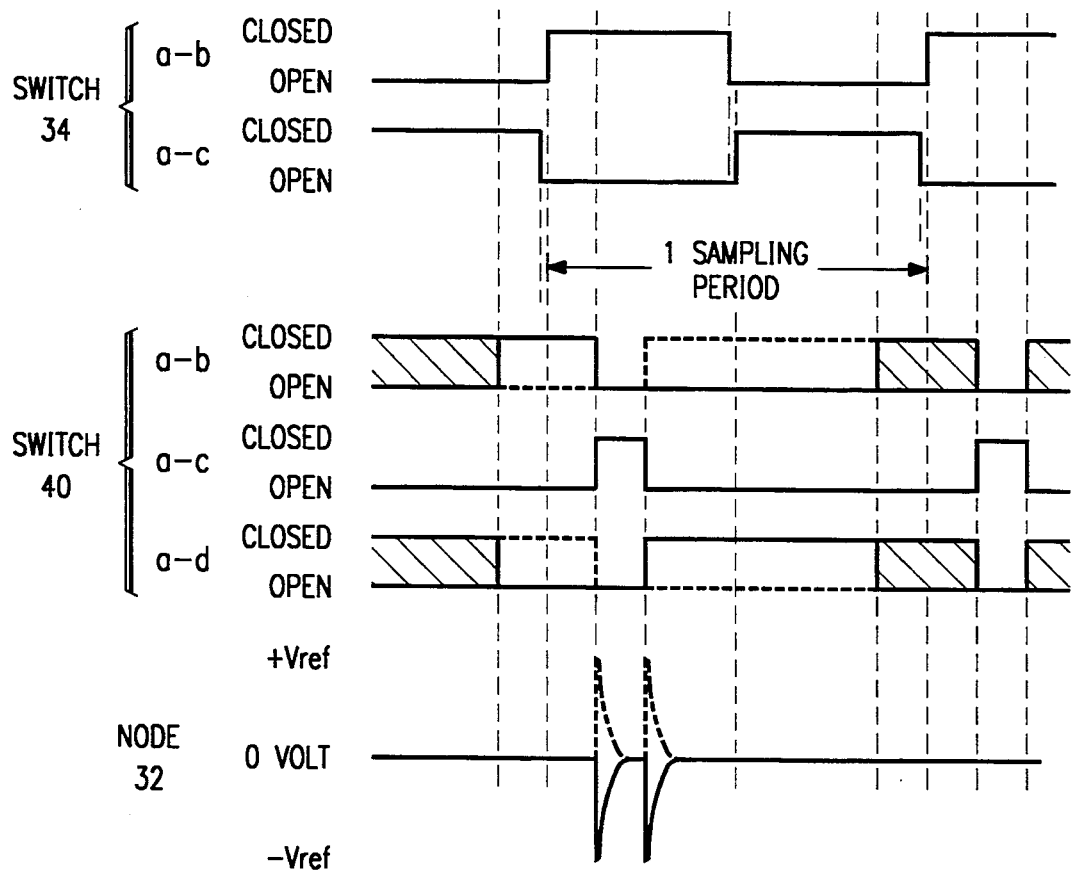
FIG. 2B is a timing diagram for the switched capacitor feedback circuit shown in FIG. 2A.
Figure 3A:
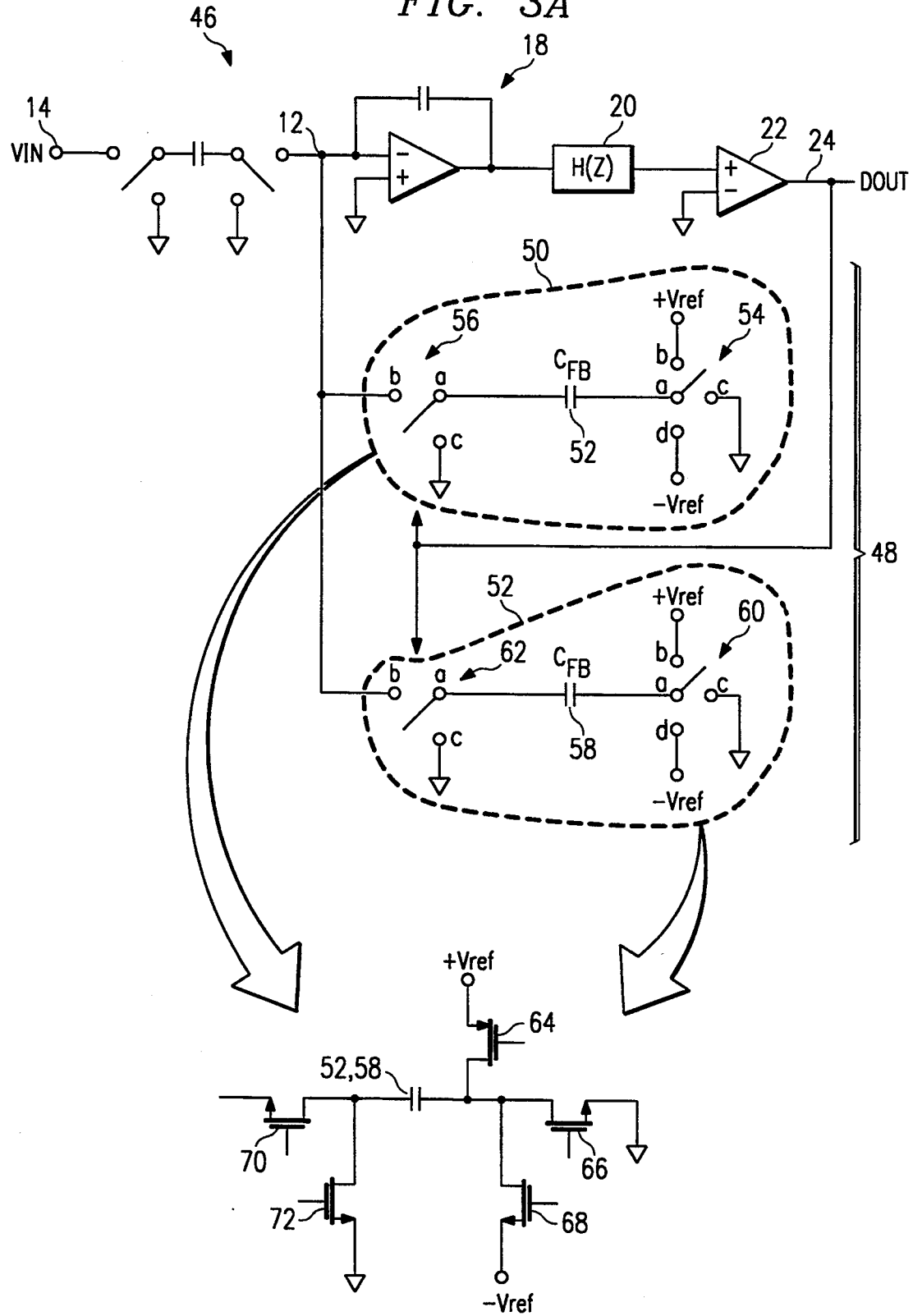
FIG. 3A is a block diagram of a delta-sigma modulator which includes the preferred embodiment of a switched capacitor feedback circuit according to the present invention.
Figure 3B:
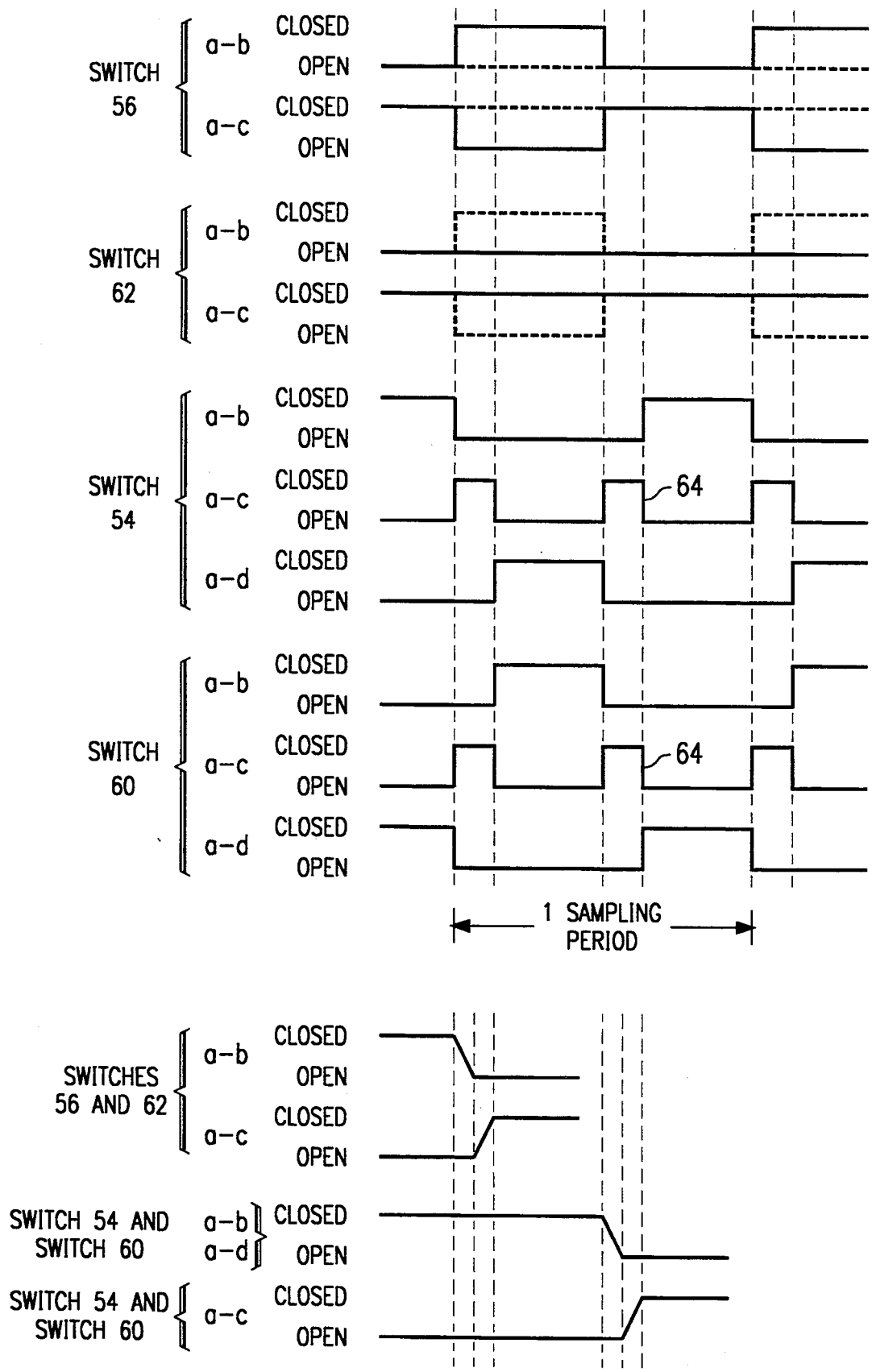
FIG. 3B is a timing diagram for the switched capacitor feedback circuit shown in FIG. 3A.

It will be appreciated that for purposes of clarity and where deemed appropriate, reference numerals have been repeated in the figures to indicate corresponding features, and that the timing signals shown in FIGS. 1B, 2B, and 3B have not necessarily been drawn to scale in order to more clearly show timing relationships in the preferred embodiment of the present invention.

DESCRIPTION OF THE PREFERRED EMBODIMENT

A switched capacitor feedback circuit as used in the preferred embodiment of the present invention utilizes a three positioned switch in the input to the feedback capacitor to thereby couple plus Vref, ground, and minus Vref to charge the capacitor in two discrete steps. By using a differential reference, and by halving the feedback capacitance, a total charge of $2 \times V_{ref} \times C_{FB}/2$ is transferred in each sampling period. This is in contrast to prior art circuits which used only Vref to provide the same charge transfer of $V_{ref} \times C_{FB}$. The invention provides the same signal charge by halving the feedback capacitance $C_{FB}$ and doubling the reference step amplitude. Thermal noise charge, however, is independent of Vref and so the invention enjoys a reduced thermal noise, Qnoise, as shown in equation 1 above. Therefore, by using the plus Vref and minus Vref, and by charging the feedback capacitor in two discrete steps, a 3 dB signal-to-noise improvement is achieved over the prior art circuit shown in FIG. 1A.

The invention provides the reduced thermal noise by adding an additional switch or "detent" in the switching process. The term detent is borrowed from mechanical switch terminology. Multi-positioned mechanical rotary switches contain detents to hold a switch in each contact position.

Turning again to the drawings, FIG. 2A is block diagram of a delta-sigma modulator 36 which uses a switched capacitor feedback circuit 38 according to the present invention. FIG. 2A is the same as FIG. 1A except that the switch 28 has been replaced by a three position switch 40.

With reference to FIG. 2B the operation of the switched capacitor feedback circuit 38 of FIG. 2A will now be described. Switch 40 initially begins in either position a-b or a-d (depending on the output of the comparator 22) with switch 34 initially at position a-c so that the capacitor $C_{FB}$ is charged to $-V_{ref}$ or $+V_{ref}$. Switch 34 then transitions to position a-b followed immediately by switch 40 transitioning to its position a-c. In this state a charge of $C_{FB}$ times Vref has been transferred to the summing node. In addition, and most importantly, the peak voltage during the charging phase which appears at node 32 is $+V_{ref}$ of $-V_{ref}$ as shown in the FIG. 2B. The next step is the transition of switch 40 to position a-d or a-b. This transition transfers an additional charge on $C_{FB}$ to the summing node and again creates a peak voltage of $-V_{ref}$ or $+V_{ref}$ on node 32. Since the capacitance of $C_{FB}$ of FIG. 2A is one-half the capacitance of $C_{FB}$ of FIG. 1A, both circuits transfer the same amount of charge to the summing node 12. But since the peak voltage swing at node 32 in FIG. 2A is the same as the peak voltage swing at node 32 in FIG. 1A, the circuit of FIG. 2A can have a 3 dB improvement of Qnoise compared to FIG. 1A without degradation caused by the hot electron effect.

Note that in FIG. 1A if the c terminal of switch 28 is connected to $-V_{ref}$ rather than ground, then the voltage peak at node 32 would be two times Vref thus creating extra voltage stress on switch 34 with the ensuing deleterious effects as mentioned above. For this reason, the extra detent in switch 40 has been added as shown in FIG. 2A. Thus, regardless of the absolute magnitude of plus Vref and minus Vref, the addition of an extra "middle position" to switch 40 has a beneficial effect of halving the peak voltage seen on switch 34 during the charging operation.

In the timing diagrams for switch 40 and for the voltage level on node 32 shown in FIG. 2B a solid line indicates the switch positions when switch 40 transitions from position a-b, through position a-c, to position a-d while the dashed line shows the switch positions when switch 40 transitions from position a-d, through position a-c, to position a-b. The shaded areas in the timing diagram for switch 40 are regions in which switches can be either closed or open depending on the output of the comparator 22 on line 24.

FIG. 3A is a block diagram of a delta-sigma modulator 46 which includes the preferred embodiment of a switched capacitor feedback circuit 48 according to the present invention. As can be seen in FIG. 3A, the switched capacitor feedback circuit 38 of FIG. 2A has been replaced by two similar circuits 50 and 52. Circuit 50 includes a capacitor 52 together with a three position switch 54 which places charge onto the capacitor 52 and a two position switch 56 which couples the charge from the capacitor 52 onto the summing node 12. Circuit 52 is similar in that it includes a capacitor 58, a three position switch 60 which provides charge to the capacitor 58, and a two position switch 62 which couples the charge from the capacitor 58 onto the summing node 12. The switched capacitor feedback circuit 48 differs from switched feedback capacitor 38 of FIG. 2A in that the three position switches 54 and 60 are not controlled by the output of the comparator 22, rather they both switch in the same repetitive sequence, although the sequence is opposite with respect to each other. More specifically, switch 54 switches from position a-b through position a-c to position a-d during each sampling period while position 60 switches from position a-d through a-c to position a-b during the same sampling periods. Also, the two position switches 56 and 60 are now controlled by the output of the comparator 22 so that one of the capacitors 52 or 58 is coupled to the summing node 12 while the other capacitor remains coupled to ground during the sampling period.

Also shown in FIG. 3A is a transistor level schematic diagram for the two circuits 50 and 52. In the schematic diagram the capacitors 52 and 58 have their charging terminals connected to the drain of a p-channel transistor 64 which has its source connected to +Vref. Thus transistor 64 forms switch position a-b. An n-channel transistor 66 is coupled between the drain of transistor 64 and ground to form the position a-c of switches 54 and 60, and an n-channel transistor 68 is coupled between the drains of transistors 64 and 66 and −Vref to form the switch position a-d of switches 54 and 60. Similarly, an n-channel transistor 70 coupled between the summing node 12 and the output of the capacitors 52 or 58 forms switch position a-b of switches 56 and 62, and another n-channel transistor, 72, is coupled between the output of the capacitors 52 and 58 and ground and forms the switch positions a-c of switches 56 and 62. The n-channel transistors 70 and 72 are placed in p wells which are biased by −Vref in the preferred embodiment.

The operation of the circuit 3A will now be described with reference to FIG. 3B. As shown in FIG. 3B switch 56 and 62 change position during the sampling period or remain constant depending on the output of the comparator 22 on line 24. In other words, depending on the output of the comparator 22, one of the circuits 50 or 52 will transfer charge to the summing node while the other circuit will not be connected to the summing node but will rather dump the charge to ground through switch position a-c of switches 56 or 62. Switches 54 and 60 always operate the same during each sampling period to provide either a positive charge or a negative charge to the summing node 12. An advantage of the circuit of FIG. 3A is that the summing node 12 begins charging at the time when the output DOUT on line 24 changes state.

The timing signals shown in FIG. 3B are the timing signals used to drive the gates of the transistors shown in FIG. 3A. More specifically, timing signals shown for position a-b of switches 56 and 62 are used as timing signals for the gate of transistor 70, the timing signals used for positions a-c of switches 56 and 62 are used as timing signals for the gate of transistor 72, the timing signals for position a-b of switches 54 and 60 are used as timing signals for the gate of transistor 64, the timing signals of switch positions a-c of switches 54 and 60 are used as the timing signals for transistor 66, and the timing signals for switch positions a-d of switches 54 and 60 are used as timing signals for the gate of transistor 68.

Also shown in FIG. 3B are details of the leading edge of the sampling period showing the relative switch timing. As is common in the art, switch position a-b of switches 56 and 62 are first broken and then switch position a-c is closed. A short time later, particularly on the order of 10 nanoseconds, switch position a-b of switch 54 and switch position a-d of switch 60 are open followed by the closing of switch positions a-c of switches 54 and 60. The width of the closure of switch position a-c of switches 54 and 60 is on the order of 200 nanoseconds. The general theory followed in the switching is to open the switches before the next position is closed. In other words, a "break-before-make" operation.

In FIG. 3B the extra pulses, shown as element 64, of position a-c of switches 54 and 60 are used to ground both sides of the feedback capacitor during each sampling period.

Also it will be appreciated by those skilled in the art the present invention can also be expanded to include not only three position switches but four or more position switches in order to allow the charge transfer to the summing node to be as large as possible while minimizing the size of the feedback capacitor $C_{FB}$. Of course, at some point, a practical limitation is reached since the additional switch positions require additional time to transfer the charge.

Figure 4A:
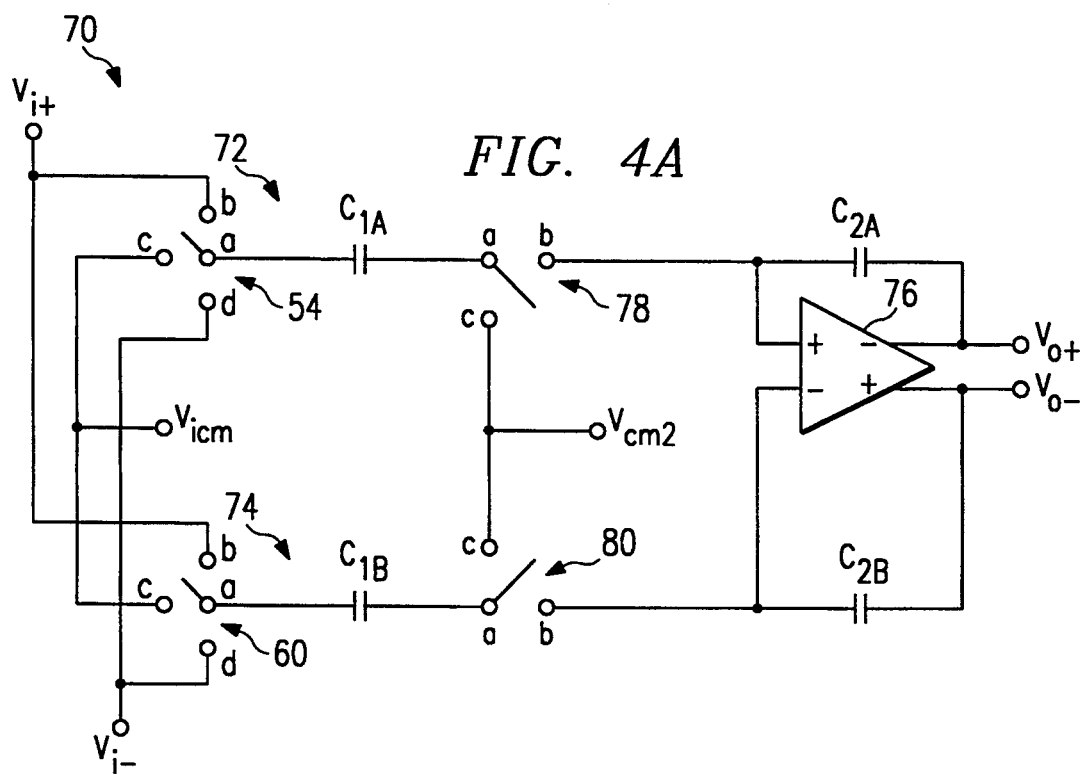
FIG. 4A is a schematic diagram of a differential switched capacitor integrator according to the present invention.

The present invention can also be applied to differential switched capacitor integrators as shown in FIG. 4A. The differential switched capacitor integrator 70 includes a first switched input capacitor circuit, shown generally as element 72, which receives as inputs a positive analog signal, $V_{i+}$, an input common mode voltage signal, $V_{icm}$, and a negative analog signal, $V_{i-}$. A second switched input capacitor circuit, shown generally as element 74, also receives as inputs $V_{i+}$, $V_{icm}$, and $V_{i-}$. The output of the first switched capacitor circuit 72 is connected to the positive input of a differential amplifier 76, and the output of the second switched capacitor circuit 74 is connected to the negative input of the differential amplifier 76. The negative output of the differential amplifier 76 forms the positive output of the integrator, $V_{o+}$, and the positive output forms the negative output of the integrator, $V_{o-}$. Coupled between the positive input and the negative output of the differential amplifier 76 is a capacitor $C_{2A}$. Coupled between the negative input and the positive output of the differential amplifier 76 is another capacitor $C_{2B}$.

The switched capacitor circuit 72 includes a capacitor $C_{1A}$ which is selectively coupled to the three input signals $V_{i+}$, $V_{icm}$, and $V_{i-}$ by switch 54. Switch 54 has its pole, shown as element "a", connected to the capacitor $C_{1A}$, its throw "b" connected to $V_{i+}$, its throw "c"

connected to $V_{icm}$, and its throw "d" connected to $V_{i-}$. Connected to the other side of capacitor $C_{1A}$ is another switch 78 which has its pole, shown as element "a", connected to the capacitor $C_{1A}$, its throw "b" connected to the positive input of the differential amplifier 76, and its throw "c" connected to a reference voltage $V_{cm2}$. The switched capacitor circuit 74 includes a capacitor $C_{1B}$ and switches 60 and 80. The capacitor $B_{1B}$, and switches 60 and 80 are connected the same as capacitor $C_{1A}$, and switches 54 and 78 respectively except that the throw "b" of switch 80 is connected to the negative input of the differential amplifier 76 instead of the positive input.

The input common mode voltage signal $V_{icm}$ is always halfway between the positive analog signal $V_{i+}$, and the negative analog signal $V_{i-}$. In other words $$V_{i+} = V_{icm} + V_{id}/2$$

$$V_{i-} = V_{icm} - V_{id}/2$$

where $V_{id}$ is the differential input voltage. The common mode reference signal $V_{cm2}$ can be the same as $V_{icm}$ but does not have to be the same. For example $V_{cm2}$ could be ground while $V_{icm}$ could be an external signal from the analog source.

Figure 4B:
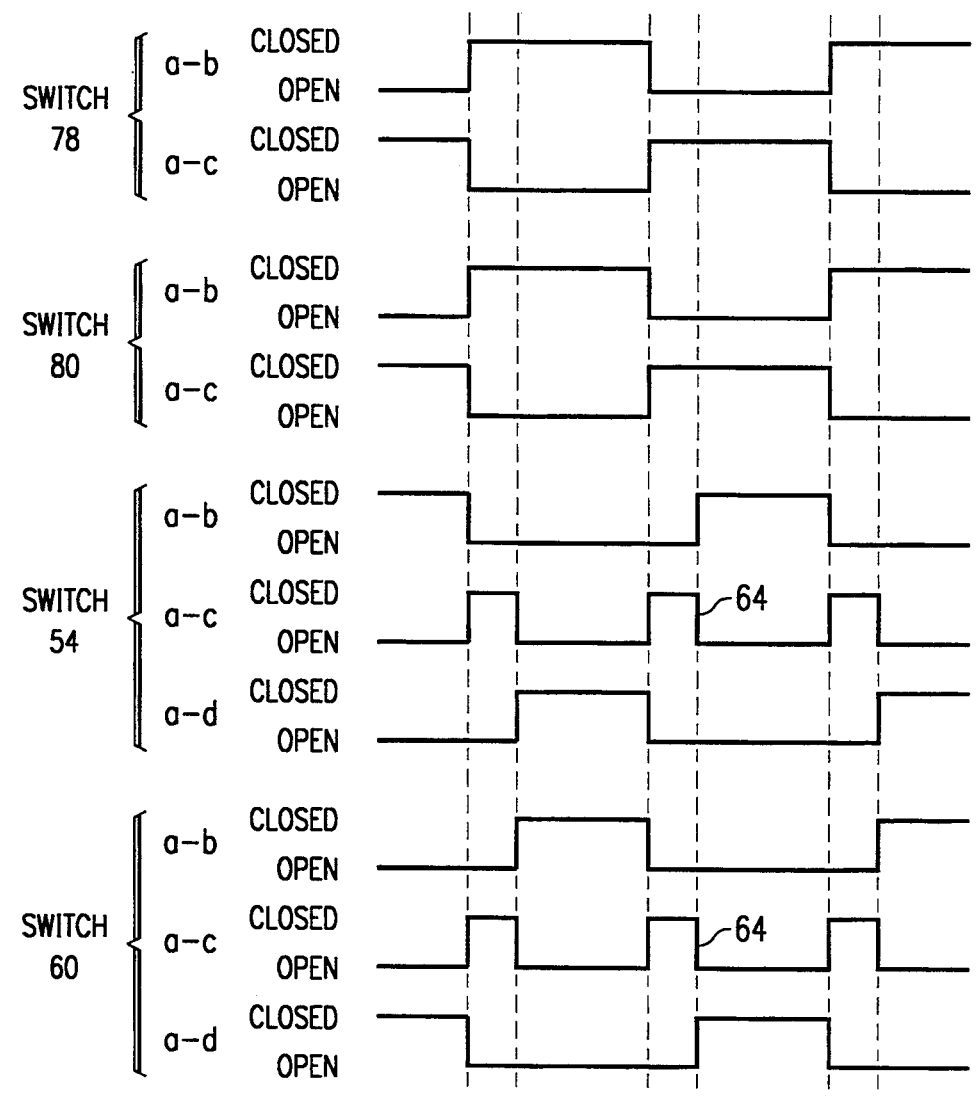
FIG. 4B is a timing diagram for the differential switched capacitor integrator shown in FIG. 4A.
Figure 4B:
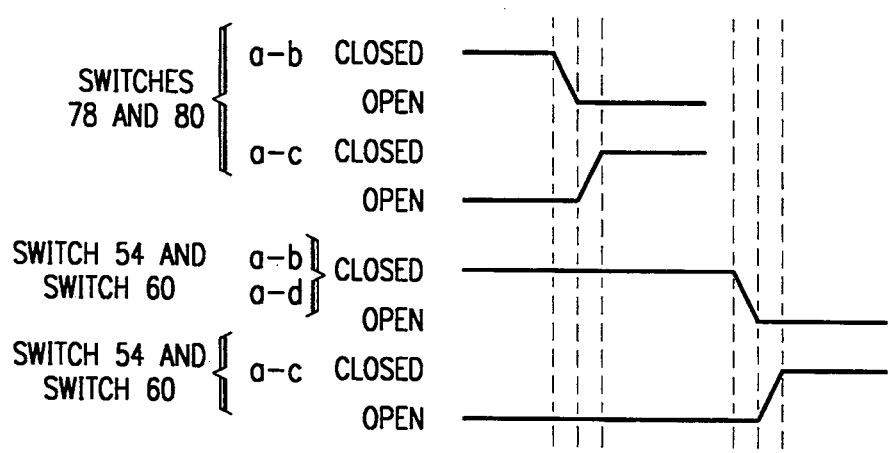

With reference now to FIG. 4B, the operation of switches 54 and 60 is the same as shown in FIG. 3B. Switches 78 and 80 operate the same as switches 56 and 62 of FIG. 3A except that switches 78 and 80 always switch from $V_{cm2}$ to one of the inputs of the differential amplifier during each sample period. Therefore each of the switched capacitor input circuits 72 and 74 transfer both differential signals to an input of the differential amplifier 76 at two different times during each sample period. As a result the maximum voltage swing at the poles of switches 78 and 80 is only equal to one-half the analog voltage, and the hot carrier effects can be avoided.

Although the invention has been described in part by making detailed reference to a certain specific embodiment, such detail is intended to be, and will be understood to be, instructional rather than restrictive. It will be appreciated by those skilled in the art that many variations may be made the structure and mode of operation without departing from the spirit and scope of the invention as disclosed in the teachings contained herein.

We claim:

1. A delta-sigma modulator for receiving an analog input signal and providing a digital output signal comprising:
   a) a summing node for summing the input signal and a feedback signal;
   b) an integrator for integrating the signal at said summing node;
   c) a loop filter for filtering the signal out of said integrator;
   d) a quantizer for digitizing the signal out of said loop filter, the output of the quantizer forming the digital output of the modulator; and
   e) a first switched capacitor circuit having a first capacitor coupled between an input terminal and an output terminal wherein the input terminal is switched to N different increasing voltages or N different decreasing voltages during a sampling period in response to said digital output of the modulator, where N is greater than 2, and the output terminal is switched between a reference voltage and said feedback signal once during said sampling period whereby the voltage stress across the output terminal during each switch to a different voltage is reduced compared to the stress which would occur if the contact were switched directly from the first of said N voltages directly to the last of said N voltages.

2. A delta-sigma modulator as set forth in claim 1 which further includes a second switched capacitor circuit having a second capacitor coupled between an input terminal and an output terminal wherein the input terminal is coupled to a different voltage N times during said sampling period in response to said digital output of the modulator, and the output terminal being switched between a reference voltage and said feedback signal once during said sampling period.

3. A delta-sigma modulator for receiving an analog input signal and providing a digital output signal comprising:
   a) a summing node for summing the input signal and a feedback signal;
   b) an integrator for integrating the signal at said summing node;
   c) a loop filter for filtering the signal out of said integrator;
   d) a quantizer for digitizing the signal out of said loop filter, the output of the quantizer forming the digital output of the modulator; and
   e) a first switched capacitor feedback circuit comprising:
      i) a three position switch having a first position coupled to a positive reference voltage, a second switch position coupled to ground, and a third position coupled to a negative reference voltage;
      ii) a feedback capacitor having a first terminal coupled to the pole of the said three position switch; and
      iii) a two position switch having a pole coupled to the second terminal of said capacitor, a first position coupled to ground and a second position coupled to said summing node.

4. The delta-sigma modulator set forth in claim 3 wherein said three position switch sequences from said first position to said second position to said third position when the output of said quantizer is at a first level, and said three position which sequences from said third position to said second position to said first position when the output of said quantizer is at a second level.

5. A delta-sigma modulator set forth in claim 3 further including a second switched capacitor circuit comprising:
   i) a three position switch having a first position coupled to a positive reference voltage, a second switch position coupled to ground, and a third position coupled to a negative reference voltage;
   ii) a feedback capacitor having a first terminal coupled to the pole of the said three position switch; and
   iii) a two position switch having a pole coupled to the second terminal of said capacitor, a first position coupled to ground and a second position coupled to said summing node;
   and wherein said first three position switch sequences from said first position to said second position to said third position in each sampling period and said second three position switch sequences from said third position to said second position to said first position in each sampling period and both of said first and second two position switches either remain in said first position during the sampling period or sequenced from said first position to said second position during the sampling period as determined by the output of said quantizer.

6. A method for converting an analog input signal to a digital signal comprising the steps of:
   a) summing the input signal with a feedback signal;
   b) integrating said sum signal to form an integrated signal;
   c) filtering said integrated signal in a loop filter to provide a filtered signal;
   d) quantizing said filtered signal in a quantizer to provide a digital output signal;
   e) transferring charge to the feedback signal comprising the steps of:
      i) charging a capacitor to a predetermined voltage by coupling a first terminal of the capacitor to a first voltage while coupling a second terminal to a first reference voltage;
      ii) coupling said second terminal to said summing node while said first terminal remains coupled to said first voltage;
      iii) coupling said first terminal to a second voltage while said second terminal remains coupled to said summing node;
      iv) coupling said first terminal to a third voltage while said second terminal remains coupled to said summing node, said second voltage having a magnitude which is between the magnitude of said first voltage and the magnitude of said third voltage, and;
   f) whereby the voltage stress on said first terminal during the voltage switching is less than the stress which would occur if said second terminal were switched directly from said first voltage to said third voltage.

7. In a delta-sigma modulator having a switched feedback capacitor which provides a charge to a summing node during a sample period, the improvement comprising providing a charge to said summing node from said feedback capacitor at two different times during said sample period.

8. The improvement set forth in claim 7 wherein said charge transferred during said two different times are of equal magnitude.

9. A switched capacitor integrator having positive and negative input terminals and positive and negative output terminals comprising:
   a) a differential amplifier having a negative output coupled to the positive output terminal, and a positive output coupled to the negative output terminal;
   a) a first switched capacitor circuit having a first capacitor coupled between an input lead and an output lead wherein the input lead is coupled sequentially to the positive input terminal, a common mode voltage, and the negative input terminal during a sampling period, and the output lead is switched between a reference voltage and a positive input of said differential amplifier once during said sampling period;
   b) a second switched capacitor circuit having a second capacitor coupled between an input lead and an output lead wherein the input lead is coupled sequentially to the negative input terminal, a common mode voltage, and the positive input terminal during a sampling period, and the output lead is switched between a reference voltage and a negative input of said differential amplifier once during said sampling period;
   c) a third capacitor coupled between said negative output of said differential amplifier and said positive input of said differential amplifier; and
   e) a fourth capacitor coupled between said positive output of said differential amplifier and said negative input of said differential amplifier.

10. In a differential switched capacitor integrator having a pair of switched input capacitors which receive positive and negative input signals, respectively, and each of said switched input capacitors provide charge to the one of two inputs of a differential amplifier during each sample period, the improvement comprising providing charge from each of said switched input capacitors to said inputs of said differential amplifier at two different times during said sample period.

11. In a delta-sigma modulator having a switched capacitor which provides a charge to a summing node during each sample period, the improvement comprising providing a charge to said summing node from said capacitor at two different times during said sample period wherein the charges provided during said sample period are always either both positive or both negative.

12. The improvement set forth in claim 11 wherein said switched capacitor is a feedback capacitor.

* * * * *